United States Patent [19]
Kashiwagi

[11] Patent Number: 5,329,692
[45] Date of Patent: Jul. 19, 1994

[54] ELECTRONIC COMPONENTS MOUNTING APPARATUS

[75] Inventor: Yasuhiro Kashiwagi, Fukuoka, Japan

[73] Assignee: Matsushita Electric Industrial Co., Ltd., Osaka, Japan

[21] Appl. No.: 796,177

[22] Filed: Nov. 22, 1991

[30] Foreign Application Priority Data

Nov. 29, 1990 [JP] Japan .................................. 2-333939

[51] Int. Cl.$^5$ .............................................. H05K 3/30
[52] U.S. Cl. ......................................... 29/740; 29/743; 29/759
[58] Field of Search ................. 29/759, 740, 741, 743

[56] References Cited

U.S. PATENT DOCUMENTS

| | | | |
|---|---|---|---|
| 4,704,792 | 11/1987 | Itagaki et al. | 29/741 |
| 4,999,909 | 3/1991 | Eguchi et al. | 29/740 |
| 5,070,601 | 12/1991 | Shitanda et al. | 29/740 |
| 5,193,268 | 3/1993 | Ono et al. | 29/739 |

FOREIGN PATENT DOCUMENTS 1300598 12/1989 Japan .

*Primary Examiner*—Carl E. Hall
*Attorney, Agent, or Firm*—Lowe, Price, LeBlanc & Becker

[57] ABSTRACT

In an of electronic components mounting apparatus pick-and-place heads are rotated for indexing along a rotary head to pick up electronic components of an electronic components feeding device and the components are mounted on a circuit board, which is positioned on an X-Y table. A moving base is moved in lateral direction, and the components placed on feeders are supplied to the pick-and-place heads. The moving base is divided into a feeding area and retreat areas, and accommodating areas for accommodating tables are provided near the retreat areas to move the tables reciprocatively between the retreat areas and the feeding areas. The tables hindering this movement are accommodated in the accommodating areas. Therefore, only a desired table is positioned in the feeding area. By moving this table at high speed, the electronic components can be supplied to the pick-and-place heads. When there is no more electronic component on a feeder, the feeder can be exchanged in the accommodating area.

19 Claims, 8 Drawing Sheets

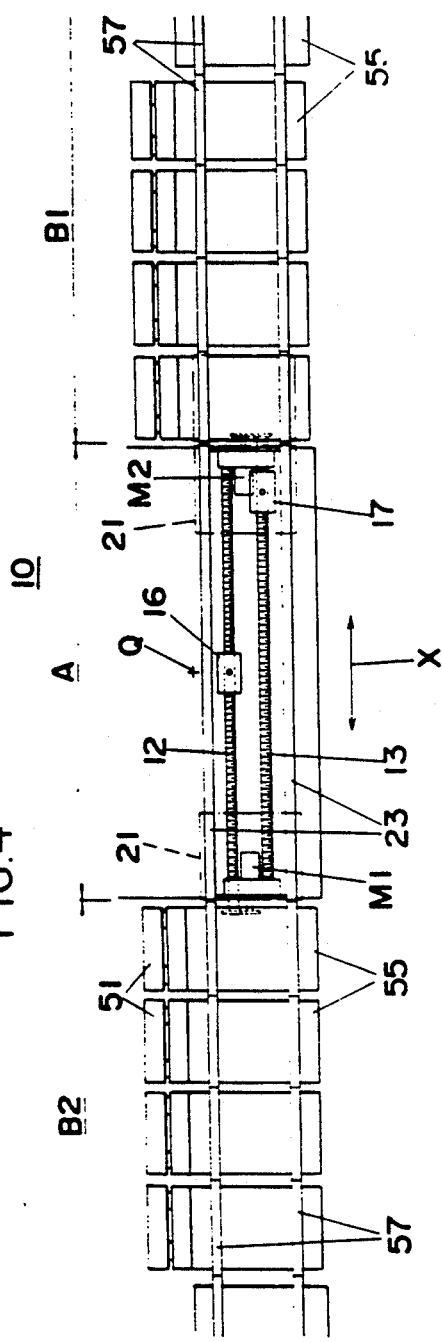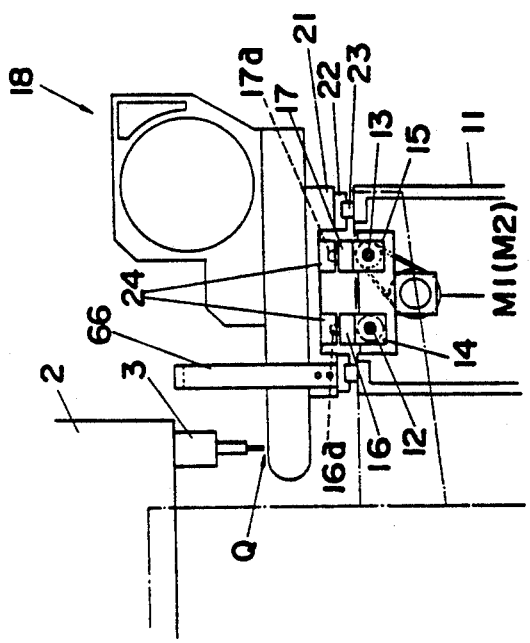
FIG.4
FIG.5

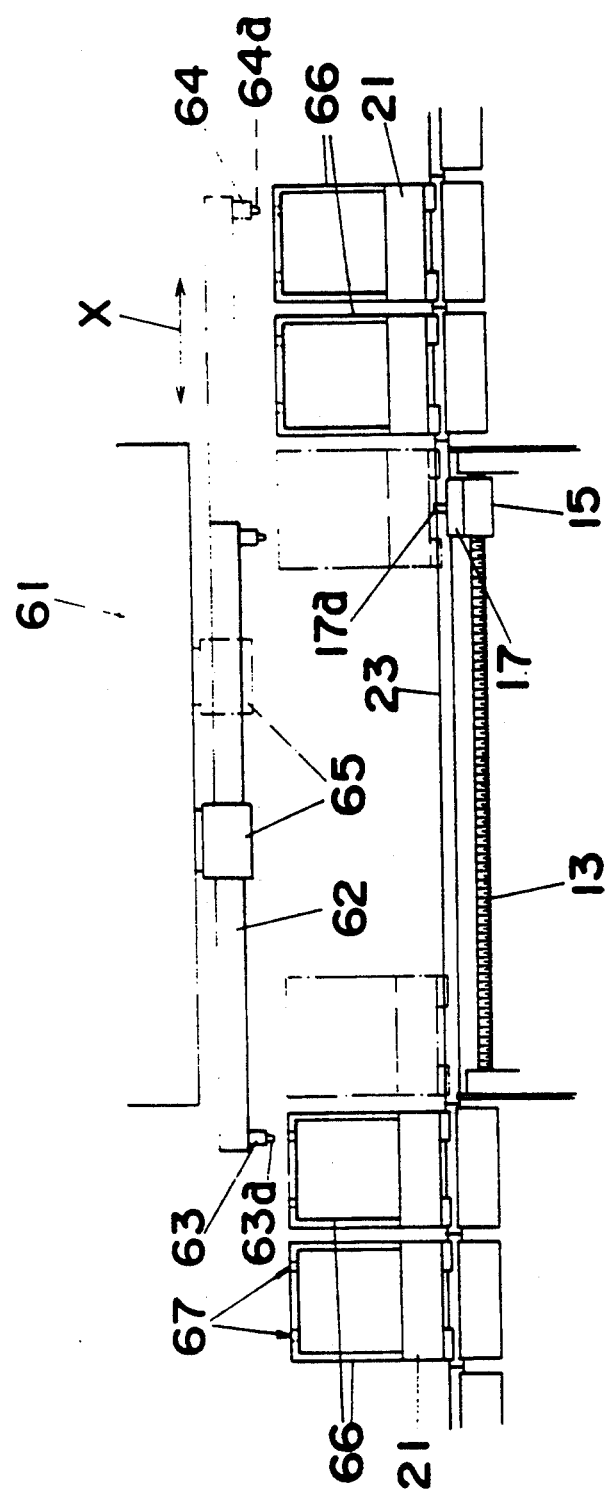

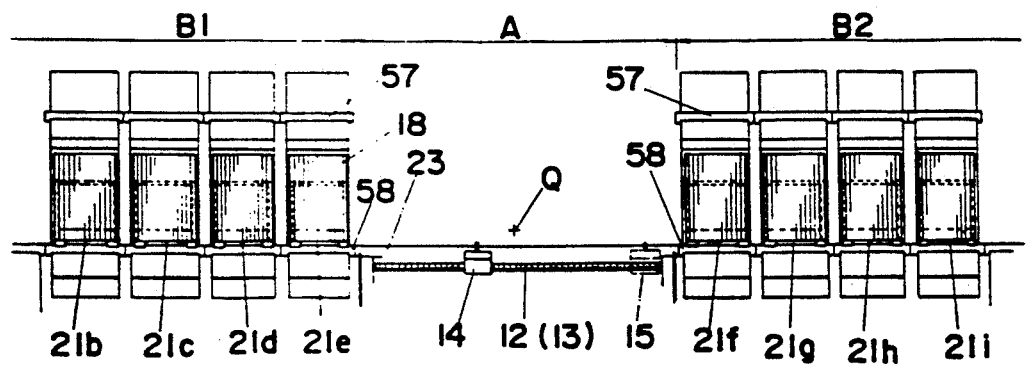
FIG. 8(a)
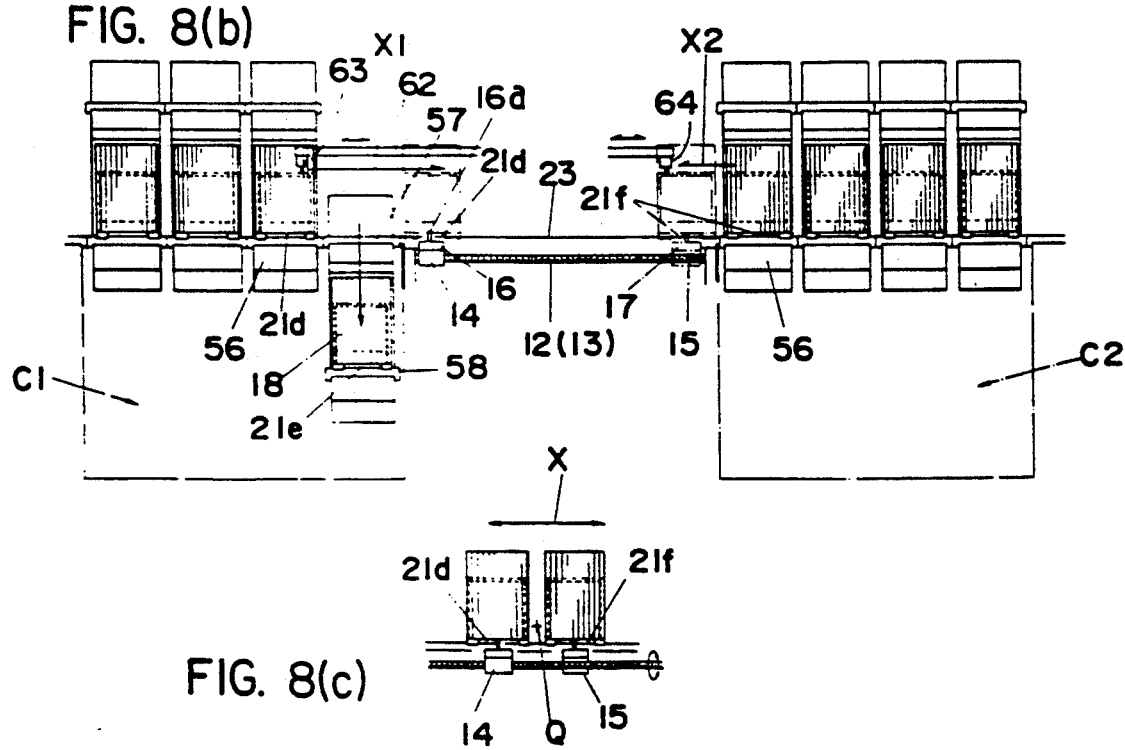
FIG. 8(b)
FIG. 8(c)

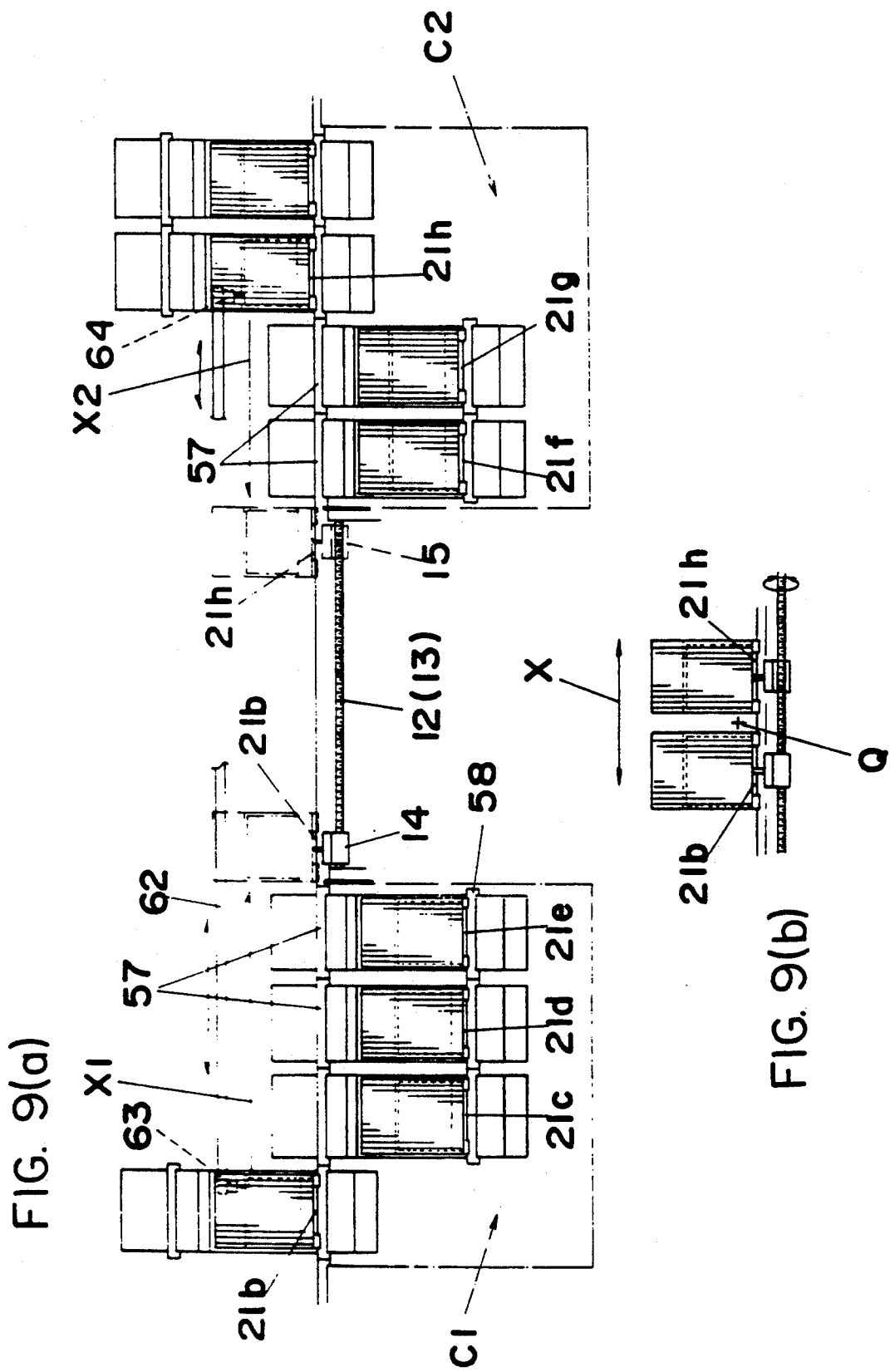

ELECTRONIC COMPONENTS MOUNTING APPARATUS

TECHNICAL FIELD

The present invention relates to an electronic components mounting apparatus, and more particularly to a structure of a device for feeding electronic components to pick-and-place heads of a rotary head.

BACKGROUND OF THE INVENTION

An apparatus for mounting electronic components on a circuit board or a substrate is already known, which comprises an electronic components feeding device, an X-Y table for positioning the circuit board, and a rotary head furnished with pick-and-place heads for mounting the electronic components on the board. The electronic components feeding device comprises tables, where the feeders of the components are mounted, and moving bases for moving the tables in a lateral direction.

The electronic components mounting apparatus as described above picks up the components from the feeders and mounts them on the circuit board, which is positioned on an X-Y table when the pick-and-place heads are rotated for indexing around an axis of the rotary head.

Further, a multi-table electronic components feeding device with a plurality of tables has been proposed (Japanese Patent Laid-Open Publication No. 1-300598). Such a multi-table feeding device independently moves each of the tables in lateral direction and it is advantageous in that the feeders can be readily exchanged when there is no more electronic component on the feeders.

With the increasing demand on quick and speedier mounting of electronic components in recent years, the moving speed of the above tables must be increased to achieve the mounting in speedy manner. The tables must be stopped at proper position so that the desired feeder stops at the correct pickup position on the pick-and-place heads. However, when the moving speed of the table is increased, the tables may be vibrated when they are stopped, and it is difficult to stop the feeder at the correct pickup position. Because the types of the electronic components to be mounted on the circuit board are increasing and are more diversified, the number of the feeders is also increasing. In some cases, 150 or more feeders must be placed on a table, and total weight of the table will be 200 kg or more. When such a weighty table is abruptly stopped from a high speed, the table tends to be subjected to great vibration. In addition, when the weighty table is required to start moving, quick start is generally difficult due to its inertia.

To solve the above problems, it has been proposed to divide the table into as many tables as possible, turning it to a multi-table. In such multi-table system, the weight of the table is light, and the moving inertia and the stopping inertia are decreased. Thus, it is possible to move the table at high speed.

However, moving means are required for each of these tables if they are designed in multi-table system, and this means that a large size apparatus is required. Ball screws and nuts or linear motor are used as the moving means, while ball screws, nuts and linear motors are very expensive. If these are used as the moving means for each of the tables, the manufacturing cost for the electronic components feeding device will be extremely expensive.

SUMMARY OF THE INVENTION

It is an object of the present invention to provide an electronic components feeding device, by which it is possible to move the multi-table system in advantageous manner. It is another object of the present invention to provide an electronic components feeding device, by which it is possible to design the entire system in compact form.

The electronic components feeding device according to the present invention comprises a plurality of tables, feeders of electronic components, a moving base where said tables are placed, moving means for reciprocatively moving said tables over the moving base, retreat areas provided on both sides of the moving base, accommodating areas provided near said retreat areas, and means for taking in and out the tables with said feeders between said retreat areas and said accommodating areas.

In the above arrangement, when the table is moved between the feeding area and the retreat area, the other tables of the retreat area are accommodated in the accommodating area and are retreated from the moving route by the means for taking in and out so that these tables may not hinder the movement.

BRIEF DESCRIPTION THE DRAWINGS

FIG. 1 is a perspective view of an electronic components mounting apparatus of the present invention;
FIG. 2 is a side view of the same;
FIG. 3 is a front view of the same;
FIG. 4 is a plan view of an electronic components feeding device;
FIG. 5 is a side view of an essential part of the same;
FIG. 6 is a dismantled perspective view of elevating means;
FIG. 7 is a front view of a second moving means; and
FIGS. 8a, 8b, 8c, 9a and 9b are front views of the apparatus in operation.

In the drawings, the reference numeral 2 represents a rotary head, 3 a pick-and-place head, 4 an X-Y table, 5 a circuit board, 10 an electronic components feeding device, 11 a moving base, 12 to 15 as well as M1 and M2 a first moving means each, 18 and 19 feeders, 21 a table, 50 means for taking in and out, 61 a second moving means, A a feeding area, B1 and B2 retreat areas and C1 and C2 accommodating areas.

DETAILED DESCRIPTION OF THE PREFERRED EMBODIMENT

In the following, description is given of an embodiment of the present invention in connection with the drawings.

Figure 1:
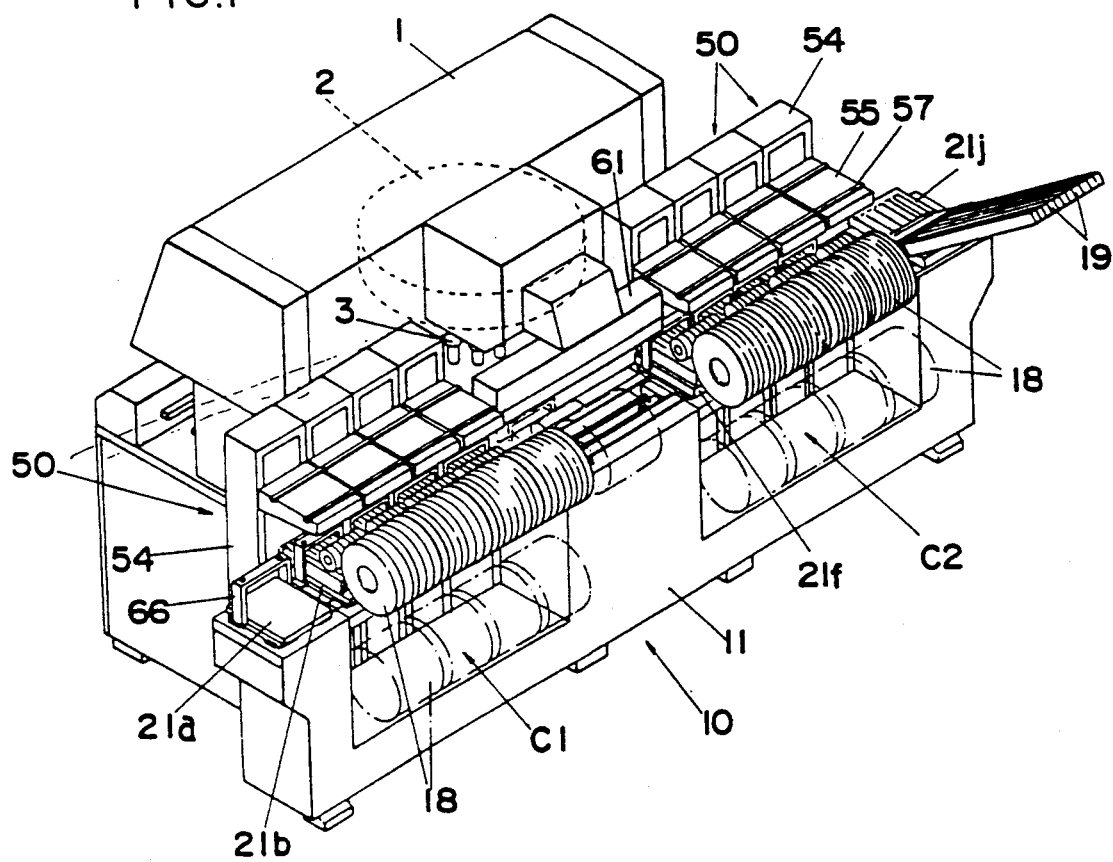
Figure 2:
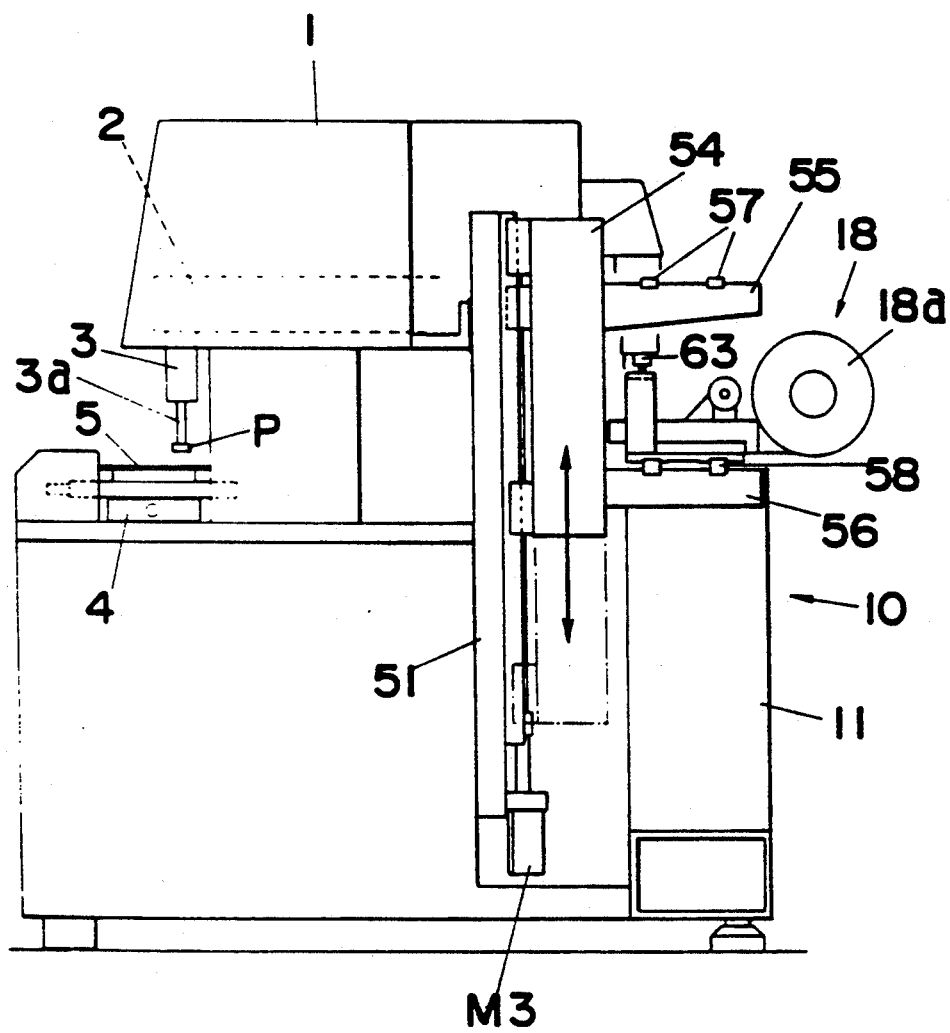

FIG. 1 is a perspective view of an electronic components mounting apparatus, and FIG. 2 is a side view of the same. The reference numeral 1 represents a main body box provided with a rotary head 2. The rotary head has a plurality of pick-and-place heads 3, which are rotated for indexing along the rotary head 2. The numeral 3a represents a nozzle for adsorbing electronic components P. An X-Y table 4 is under front side of the rotary head 2 for moving a circuit board 5 in X or Y direction. On a rear side of the rotary head 2, there is provided an electronic components feeding device 10, the structure of which will be explained below in detail.

Figure 3:
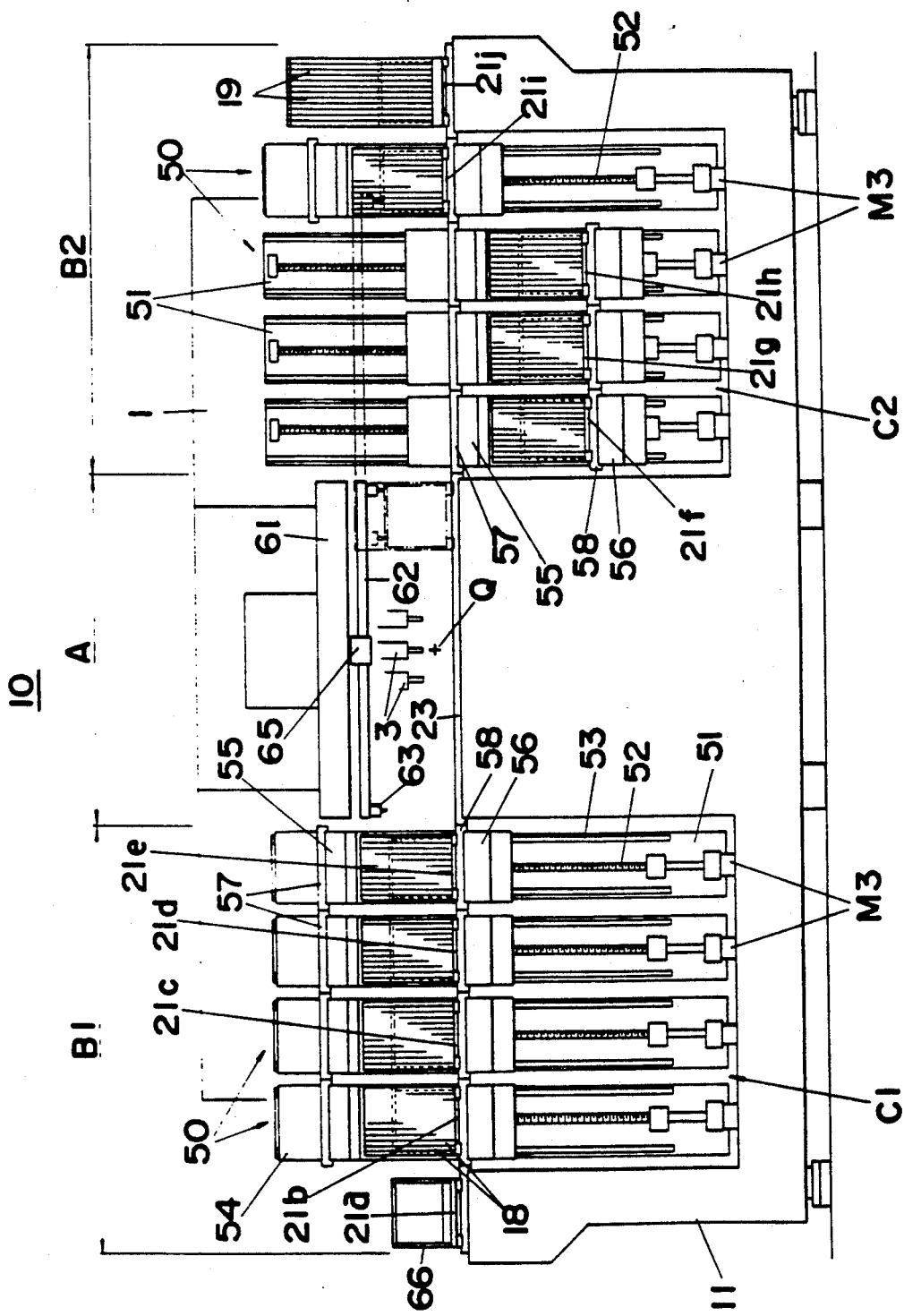

In FIGS. 1 and 3, the reference numeral 11 indicates a moving base, on which a plurality of tables 21 are mounted. The present embodiment has ten tables 21 (21a to 21j). Dividing the tables 21 into a plurality of smaller tables, results in a reduction in weight per table. Thus, even when the tables are moved over the moving base 11 at high speed and are stopped suddenly, severe vibration does not occur by shock. Accordingly, the tables can be stopped at correct stopping positions, and they can also be properly started.

Table feeders 18 are placed on the tables 21b to 21i. On the table 21j at the right end, a tube feeder 19 is mounted. Because the table 21a at the left end is a reserve table, no feeder is placed on it. The moving base 11 is divided into a central feeding area A and retreat areas B1 and B2 on both sides. As will be described below, the electronic components on the feeders 18 and 19 are sent to the pick-and-place heads 3 in the feeding area A. Under the retreat areas B1 and B2, accommodating areas C1 and C2 are provided for the feeders 18. The feeders 18 and 19 where there is no more electronic component are exchanged in the retreat areas B1 and B2 and in the accommodating areas C1 and C2.

As shown in FIG. 4, two ball screws 12 and 13 are provided in the feeding area A. Nuts 14 and 15 are mounted as seen in FIG. 5. Also, cylinders 16 and 17 are disposed on the nuts 14 and 15. M1 and M2 indicate driving motors for the ball screws 12 and 13.

As shown in FIG. 5, sliders 22 are arranged on both sides of the tables 21. The sliders 22 are engaged on rails 23 furnished on the moving base 11. The tables 21 are provided with engaging units 24 on lower surfaces thereof. When rods 16a and 17a of the above cylinders 16 and 17 are protruded, they are engaged with the engaging units 24.

When the motor M1 is driven and the ball screw 12 is rotated with one of the rods, i.e. 16a, engaged with the engaging unit 24, the table 21 moves in a lateral direction X in the feeding area and the feeders 18 and 19 which accommodate the desired electronic components stop at one pickup position Q for the pick-and-place head 3. Similarly, when the motor M2 is driven with the other rod 17 engaged with the engaging unit 24, the tables 21 moves in lateral direction X. Specifically, the ball screws 12 and 13, the nuts 14 and 15, and the motors M1 and M2 constitute a first moving means to move the tables 21 in lateral direction X in the feeding area A. The ball screws 12 and 13 and the nuts 14 and 15 have high feeding accuracy and can properly stop the desired feeders 18 and 19 at said pickup position Q.

Figure 6:
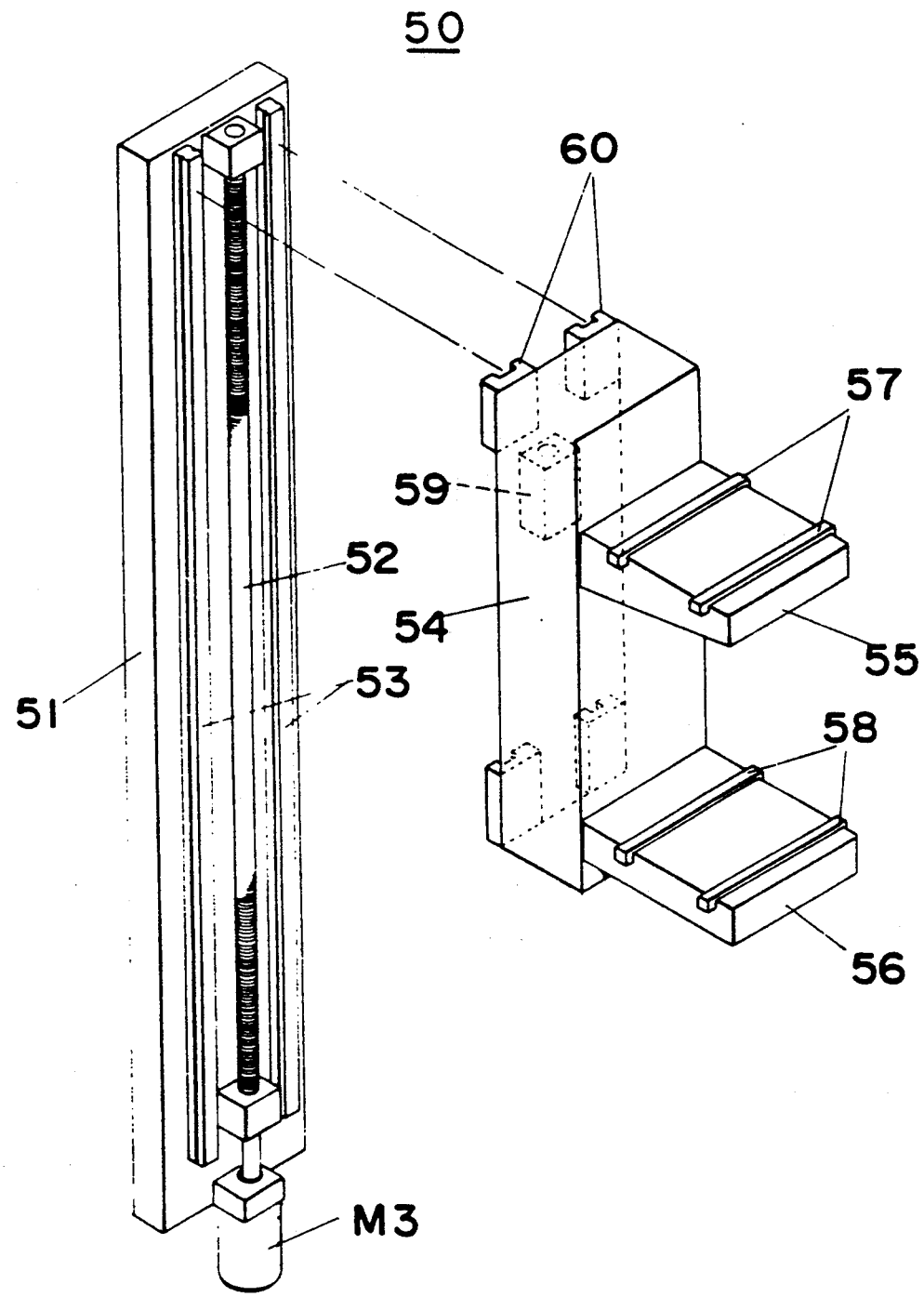

FIG. 6 shows taking-in-and-out means 50 for the tables 21b to 21i in the retreat areas B1 and B2. This taking-in-and-out means 50 is a means for accommodating the tables 21b to 21i, on which the feeder 18 is placed in the retreat areas B1 and B2, into the accommodating areas C1 and C2. The reference numeral 51 indicates a guide plate equipped with a ball screw 52 and rails 53. M3 is a driving motor for the ball screw 52. An elevating plate 54 has an upper base plate 55 and a lower base plate 56. The base plates 55 and 56 have rails 57 and 58 in parallel to the rails 23 of said moving base 11. On the lower base plate 56, the table 21 is mounted, and the upper rails 57 are bypass rails, which the other tables 21 pass through.

On rear side of the elevating plate 54, there are provided a nut 59 to be screwed into the ball screw 52 and sliders 60 to be fitted on the rails 53. Four each of the taking-in-and-out means are provided on rear sides of the retreat areas B1 and B2 of the moving base 11. Because there is no need to accommodate the tables 21a and 21j on both ends into the accommodating areas C1 and C2, said means 50 is not provided.

When the motor M3 is started, the elevating plate 54 moves in vertical direction. As shown in FIG. 3, the elevating plate 54 moves upward and the lower rails 58 are on the same level as the rails 23 of the moving base 11 in the left retreat area B1. Under this condition, the tables 21a to 21e on the base plate 56 reciprocatively slide on the rails 23 and 58 between the retreat area B1 and the feeding area A. In FIG. 3, the tables 21f to 21h move down and the upper rails 57 are on the same level as the rails 23 of the moving base 11 in the right retreat area A. Thus, when the tables 21f to 21h before the table 21i are accommodated in the accommodating areas C2, the table 21i slides freely on the rails 57 between the retreat area B2 and the feeding area A.

In FIGS. 1, 3 and 7, the reference numeral 61 represents a rodless cylinder. This rodless cylinder 61 has a sliding member 65, which slides in lateral direction X. The sliding member 65 has a horizontal arm 62. On both sides of the arm 62, cylinders 63 and 64 are provided. The reference numerals 63a and 64a indicate rods.

In FIG. 7, portal frames 66 are provided on the 5 tables, and holes 67 are formed on the portal frames. When the rods 63a and 64a of the cylinders 63 and 64 are protruded, they are engaged in the holes 67. When the sliding member 65 moves in lateral direction X with the rods 63a and 64a engaged in the holes 67, the tables 21 slide on the rails 23 and 58 reciprocatively between the feeding area A and the retreat areas B1 and B2. That is, this rodless cylinder 61 serves as a second moving means for the tables 21. This second moving means is to reciprocatively move the tables 21a to 21j between the feeding area A and the retreat areas B1 and B2. Unlike the above first moving means, there is no need for the second means to have high feeding accuracy. Accordingly, less expensive rodless cylinder 61 is used for this purpose. Besides the rodless cylinder 61, a timing belt may be used.

The present apparatus has the arrangement as described above. In the following, description is given on the operation of the apparatus in connection with FIGS. 8 and 9.

In FIG. 8 (a), the tables 21b to 21e are positioned in the left retreat area B1, while the tables 21f of 21i are in the right retreat area B2. All the tables 21b to 21i are at the elevated positions, and the rails 58 are on the same level as the rails 23.

If, for example, the table 21d is to be moved from the retreat area B1 to the feeding area A, the taking-in-and-out means 50 is driven to move the table 21e down. The feeder 18 on the table 21e is accommodated in the accommodating area C1, and the upper rail 57 is brought to the same level as the rail 23. Subsequently, the cylinder 63 is moved to just above the frame 66 of the table 21d, and the rod 63a is engaged in the hole 67. Then, if the cylinder 63 is moved in lateral direction X1, the table 21d is moved toward above the nut 14. (See chain lines in FIG. 8 (b).) The rod 63a of the cylinder 63 is then released from the hole 67, and the rod 16a of the cylinder 16 is engaged with the engaging unit 24 of the table 21d. (See also FIG. 5.)

The motor M1 is driven to move the table 21d toward the central part of the feeding area A. If the table 21e on the middle of the moving path of the table 21d is accommodated in the lower accommodating area C1, the table 21d may be moved from the retreat area B1 to the feeding area A.

When the table 21f is to be moved from the retreat area B2 to the feeding area A, the rod 64a of the cylinder 64 is engaged in the holes 67 of the frame 66 as shown in FIG. 8 (b). By moving the cylinder 64 toward left direction X2, the table 21f is move toward above the nut 15. Next, the rod 17a of the cylinder 17 is engaged with the engaging unit 24, and the motor M2 is driven to move the table 21f toward central part of the feeding area A.

When the desired tables 21d and 21f are moved to the feeding area A as described above, the motors M1 and M2 are driven. By moving the tables 21d and 21f in lateral direction X, the desired feeder 18 is stopped at the pickup position Q of the pick-and-place heads, and the electrical components are fed to the pick-and-place heads 3.

When the table 21d is to be returned to the retreat area B1, the table 21d is moved up to the left end of the ball screw 12, and the table 21d is returned to the base plate 56 by the cylinder 63. To return the table 21f to the retreat area B2, the table 21f is moved up to the right end of the ball screw 13, and the table 21f is returned to the base plate 56 by the cylinder 64.

In FIG. 9, when the tables 21b and 21h are to be moved to the feeding area A, the tables 21c to 21e are accommodated in the accommodating area C1, and the tables 21f and 21g in the accommodating area C2. Next, the tables 21b and 21h are moved toward above the nuts 14 and 15 by the cylinders 63 and 64. Then, the motors M1 and M2 are driven to move the tables 21b and 21h toward central part of the feeding area A. By moving the tables 21b and 21h in lateral direction X, the electronic components are fed to the pick-and-place heads 3.

As described above, it is possible according to the present apparatus to freely and reciprocatively move the tables 21 between the retreat areas B1 and B2 and the feeding area A. When there is no more electronic component on the feeder 18, the feeder 18 is kept in the accommodating areas C1 and C2. In so doing, the other tables can move freely between the feeding area A and the retreat areas B1 or B2 without being hindered by the feeder 18. The feeder 18 with no components can be exchanged during this period, and this is advantageous in view of working efficiency and safety.

As described above, there is no need to furnish the taking-in-and-out means 50 or the accommodating areas C1 and C2 for the tables 21a and 21j on both ends because the other tables 21b to 21i do not pass there. In the above embodiment, the accommodating areas C1 and C2 are provided in the moving base 11, and the interfering table 21 is moved down and accommodated in the accommodating areas C1 and C2, whereas the table 21 may be moved up and accommodated above the moving base 11. In this case, the table 21 is placed on the base plate 55, and the lower rail 58 serves as a bypass rail. Or, the accommodating areas may be furnished on front side and back side of the moving base 11, and the tables may be taken in or out between the retreat area and the accommodating area by moving the tables horizontally toward forward or backward directions. In other words, the accommodating area may be installed near the retreat area to simplify the operation to take in and out. Further, a linear motor may be provided instead of the above ball screws 12 and 13 and the rodless cylinder 61. In this case, the linear motor is furnished as striding over the feeding area A and the retreat areas B1 and B2, and this linear motor serves as a first moving means and a second moving means at the same time.

Thus, the following effects can be obtained by the present invention:

(1) Because only a desired table is selected from a plurality of tables and is placed on the feeding area to supply the electronic components to the pick-and-place heads, an apparatus can be provided, which can cope with the production of diverse types of electronic components.

(2) By a multi-table system, each table can be furnished in lightweight design. This makes it possible to minimize the vibration of the tables. Because the moving inertia is minimal, the tables can be stopped at high accuracy, and the desired feeder can be stopped at the correct pickup position. Also, because the tables can be moved at high speed, the electronic components can be supplied quickly to the pick-and-place heads, and the electronic components can be mounted on the circuit board at high speed.

(3) By accommodating the hindering tables in the accommodating area, it is possible to reciprocatively move the desired table quickly and freely between the feeding area and the retreat areas.

What is claimed is:

1. An electronic components mounting apparatus, comprising a plurality of pick-and-place heads mounted on a rotary head and indexed by rotation of the rotary head, an electronic components feeding device for feeding electronic components to said pick-and-place heads, and an X-Y table for positioning a circuit board relative to said rotary head, the electronic components of said electronic components feeding device being picked up by said pick-and-place heads and mounted on said circuit board, characterized in that:

said electronic components feeding device comprises a plurality of tables, each of said tables having electronic component feeders, a moving base where said tables are provided, a first moving means for reciprocatively moving said tables over the moving base along a first path, a retreat area provided along said first path, an accommodating area provided near said retreat area, and second moving means for moving the tables, provided with said feeders, away from said first path along a second path extending between the retreat area and the accommodating area, said second moving means being operative for moving said tables away from said first path to said accommodating area for enabling successive ones of said tables to move to said rotary head along said first path.

2. An apparatus as recited in claim 1, further comprising means for defining said first path and means for defining said second path, wherein said second moving means comprises first means for permitting said tables to move along said first path and second means for permitting said tables to move along said second path.

3. An electronic components mounting apparatus according to claim 1, wherein said accommodating area is below said retreat area, and said second moving means comprises a base plate for moving up and down between the retreat area and the accommodating area, and said tables are placed on rails of the base plate.

4. An electronic components mounting apparatus, comprising a plurality of pick-and-place heads mounted on a rotary head and indexed by rotation of the rotary head, an electronic components feeding device for feeding electronic components to said pick-and-place heads, and an X-Y table for positioning a circuit board relative to said rotary head, the electronic components of said electronic components feeding device being picked up by said pick-and-place heads and mounted on said circuit board, characterized in that:

said electronic components mounting apparatus comprises a plurality of tables, each of said tables having electronic component feeders, a moving base where said tables are provided, a first moving means for moving said tables in a feeding area at a central part of the moving base along a first path in order to stop said feeders at a pickup position on said pick-and-place heads, a second moving means for moving said tables between said feeding area and retreat areas on both sides of said feeding area, and a third moving means for moving the tables between an accommodating area of said feeders and said retreat areas, said accommodating area installed near said retreat areas, said third moving means being operative for moving said tables away from said first path to said accommodating areas for enabling successive ones of said tables to move to said rotary head along said first path.

5. An electronic components mounting apparatus according to claim 4, wherein said first moving means comprise ball screws and nuts mounted on said moving base.

6. An electronic components mounting apparatus according to claim 4, wherein said second moving means comprises a rodless cylinder.

7. An electronic components mounting apparatus according to claim 4, wherein said second moving means is installed above said moving base, and said second moving means has an engaging and disengaging member for engaging with or disengaging from engaging units provided on said tables.

8. An electronic components mounting apparatus according to claim 7, wherein said engaging and disengaging member comprises a cylinder and said engaging units comprise frames installed on said tables.

9. An apparatus for mounting electronic components, comprising:

X-Y tables means (4) for positioning a circuit board;
a plurality of second table means;
first moving means for moving said second table means along a first movement path between a feed area (A) and a waiting area (B1, B2) which is located adjacent to the feeding area;
a plurality of accommodating means (18,19) for accommodating electronic components, at least one of the accommodating means being capable of being placed on the second table means;
pick up-and-place means for picking up the electronic components accommodated in the accommodating means on one of said second table means located in the feeding area and for placing the electronic components picked up on the circuit board positioned by the X-Y movable table means; and
second moving means for shunting at least one of the second table means located in the waiting area away from the first movement path along a second movement path,
said second moving means being operative for shunting said at least one of said second table means along said second movement path away from said first movement path for enabling successive ones of said second tables to move to said feeding area along said first movement path.

10. The apparatus of claim 9, further comprising a base plate having guides for guiding the second table means, the base plate being located in the first movement path in the waiting area, and wherein the second moving means is operative to move the base plate from the first movement path to retreat the second table means on the base plate away from the first movement path.

11. An apparatus for mounting electronic components, comprising:

X-Y table means (4) for positioning a circuit board;
a plurality of second table means;
first moving means for moving said second table means along a first movement path between a feeding area (A) and a waiting area (B1, B2) which is located adjacent to the feeding area;
a plurality of accommodating means (18, 19) for accommodating electronic components, at least one of the accommodating means being capable of being placed on the second table means:
pick up-and-place means for picking up the electronic components accommodated in the accommodating means on one of said second table means located in the feeding area and for placing the electronic components picked up on the circuit board positioned by the X-Y movable table means; and
second moving means for withdrawing at least one of the second table means located in the waiting area away from the first movement path along a second movement path,
the first moving means having third moving means for moving the second table means to sequentially locate the accommodating means on the second table means at positions directly below pick-up positions in which the pick up-and-place means picks up the electronic components in the feeding area, and fourth moving means for moving the second table means between the waiting area and the feeding area,
said second moving means being operative for withdrawing said at least one of said second table means along said second movement path away from said first movement path for enabling sequential ones of said second tables to move to said feeding area along said first movement path.

12. The apparatus of claim 11, further comprising a base plate having guides for guiding the second table means, the base plate being located in the first movement path in the waiting area, and wherein the second moving means is operative to move the base plate from the first movement path to retreat the second table means on the base plate away from the first movement path.

13. The apparatus of claim 12, further comprising a first base plate located in the first movement path in the waiting area and having rails for guiding the second table means, and a second base plate located outside the first movement path and having rails for guiding the second table means, and wherein the second moving means is operative to retreat the first base plate from the first movement path to retreat the second table means from the first movement path, and to move the second base plate to a position in which the retreated second table means lie in the first movement path.

14. An apparatus for mounting electronic components, comprising:

an electronic components feeding device for feeding electronic components;

an X-Y table for positioning a circuit board;

a plurality of pick-and-place heads for picking up the electronic components fed from the electronic components feeding device, and for mounting the electronic components on the circuit board positioned by the X-Y table; and a rotary head for moving the pick-and-place heads between the electronic components feeding device and the X-Y table;

the improvement comprising:

feeders for feeding the electronic components;

a plurality of second tables provided with the feeders;

first moving means for moving the second tables along first movement paths between retreat areas and a feed area in which the electronic components are fed to the pick-and-place heads; and second moving means for retreating the second tables away from the first movement paths along second movement paths to the retreat areas, said second moving means being operative for retreating said second tables along said second movement path away from said first movement path thereby positioning sequential ones of said second tables for movement of said rotary head along said first movement path.

15. The apparatus of claim 14, further comprising a base plate having guides for guiding the second tables, the base plate being located in the first movement paths in the retreat areas, and wherein the second moving means is operative to move the base plate from the first movement paths to retreat the second tables on the base plate from the first movement paths.

16. An apparatus for mounting electronic components, comprising:

an electronic components feeding device for feeding electronic components;

an X-Y table for positioning a circuit board;

a plurality of pick-and-plate heads for picking up the electronic components fed from the electronic components feeding device, and for mounting the electronic components on the circuit board positioned by the X-Y table; and a rotary head for moving the pick-and-place heads between the electronic components feeding device and the X-Y table;

the improvement comprising:

feeders for feeding the electronic components;

a plurality of second tables provided with the feeders;

wherein the secodn tables are movably located o nfirst movement paths along which the second tables are moved between retreat areas and a feed area in which the electronic components are fed to the pick-and-place heads;

first moving means for moving the second tables to sequentially locate the feeders on the second tables at positions directly below pickup positions in which the pick-and-place heads pick up the electronic components in the feed area;

second moving means for moving the second tables from the retreat areas to the feed area; and third moving means for moving the second tables away from the first movement paths to the retreat areas, said third moving means being operative for moving said second tables away from said first movement path thereby positioning sequential ones of said second tables for movement to said feed area along said first movement paths.

17. The apparatus of claim 16, further comprising a base plate having guides for guiding the second tables, the base plate being located in the first movement paths in the retreat areas, and wherein the third moving means is operative to move the base plate from the first movement paths to retreat the second tables on the base plate away from the first movement paths.

18. An apparatus for mounting electronic components, comprising:

an electronic components feeding device for feeding electronic components;

an X-Y table for positioning a circuit board;

a plurality of pick-and-place heads for picking up the electronic components fed from the electronic components feeding device, and for mounting the electronic components on the circuit board positioned by the X-Y table; and a rotary head for moving the pick-and-place heads between the electronic components feeding device and the X-Y table;

the improvement comprising:

feeders for feeding the electronic components;

a plurality of second tables provided with the feeders;

first moving means for moving the second tables along movement paths between retreat areas and a feed area in which the electronic components are fed to the pick-and-place heads; and a first base plate located in the movement paths in the retreat areas and having rails for guiding the second tables;

a second base plate located outside the movement paths and having rails for guiding the second tables; and second moving means for retreating the first base plate from the movement paths to retreat the second tables away from the movement paths, and for moving the second base plate to a position in which the retreated second tables lie in the movement paths, said second moving means being operative for retreating said first base plate and said second tables away from said movement paths for enabling successive ones of said second tables to move to said rotary head along said movement paths.

19. An electronic components mounting apparatus, comprising a plurality of pick-and-place heads mounted on a rotary head and indexed by rotation of the rotary head, and electronic components feeding device for feeding electronic components to said pick-and-place heads, and an X-Y table for positioning a circuit board relative to said rotary head, the electronic components of said electronic components feeding device being picked up by said pick-and-place heads and mounted on said circuit board, characterized in that:

said electronic component feeding device comprises a plurality of tables, each of said tables having electronic component feeders, a moving base where said tables are provided, a first moving means for reciprocatively moving said tables over the moving base along a first path, retreat areas provided along said first path, accommodating areas provided near said retreat areas, and second moving means for moving the tables, provided with said feeders, away from said first path along a second path extending between the retreat areas and the accommodating areas, said second moving means being operative for moving said tables away from said first path to said accommodating areas thereby positioning successive ones of said tables for movement to said rotary head along said first path.

* * * * *